United States Patent
Briet et al.

(10) Patent No.: US 7,550,992 B2
(45) Date of Patent: Jun. 23, 2009

(54) LOGIC CELL WITH TWO ISOLATED REDUNDANT OUTPUTS, AND CORRESPONDING INTEGRATED CIRCUIT

(75) Inventors: Michel Briet, Ligne (FR); Arnaud Verdant, Reze (FR)

(73) Assignee: Atmel Nantes SA, Nantes Cedex (FR)

( * ) Notice: Subject to any disclaimer, the term of this patent is extended or adjusted under 35 U.S.C. 154(b) by 8 days.

(21) Appl. No.: 11/506,759

(22) Filed: Aug. 18, 2006

(65) Prior Publication Data

US 2007/0063728 A1    Mar. 22, 2007

(30) Foreign Application Priority Data

Aug. 18, 2005   (FR)   .................... 05 08606

(51) Int. Cl.
  *H03K 19/003* (2006.01)
  *H03K 19/20* (2006.01)
  *H03K 19/094* (2006.01)
(52) U.S. Cl. ................. 326/10; 326/112; 327/198
(58) Field of Classification Search ............... 326/9–11, 326/104–121
See application file for complete search history.

(56) References Cited

U.S. PATENT DOCUMENTS

| 5,111,429 | A  |    | 5/1992  | Whitaker ................ 365/156 |
| 5,406,513 | A  |    | 4/1995  | Canaris et al. ........... 365/181 |
| 5,418,473 | A  | *  | 5/1995  | Canaris ................... 326/27 |
| 5,465,054 | A  | *  | 11/1995 | Erhart .................... 326/34 |
| 6,133,747 | A  | *  | 10/2000 | Cameron .................. 326/9 |
| 6,232,799 | B1 | *  | 5/2001  | Allen et al. ............. 326/113 |
| 6,236,239 | B1 | *  | 5/2001  | Kogushi .................. 326/88 |
| 6,784,694 | B2 | *  | 8/2004  | Kim et al. ............... 326/95 |
| 2005/0168250 | A1 |  | 8/2005 | Lin ...................... 327/112 |
| 2006/0028247 | A1 | * | 2/2006 | Hara et al. ............. 326/104 |

* cited by examiner

*Primary Examiner*—Vibol Tan
*Assistant Examiner*—Dylan White
(74) *Attorney, Agent, or Firm*—Westman, Champlin & Kelly, P.A.

(57) ABSTRACT

The disclosure relates to a logic cell for an integrated circuit, including two redundant outputs, a first output equipped with an output transistor of type P and a second output equipped with an output transistor of type N. Such a cell includes isolation element connecting the first and second outputs and forming an isolation resistance.

13 Claims, 8 Drawing Sheets

LOGIC CELL WITH TWO ISOLATED REDUNDANT OUTPUTS, AND CORRESPONDING INTEGRATED CIRCUIT

CROSS-REFERENCE TO RELATED APPLICATION

None.

FIELD OF THE DISCLOSURE

The field of the disclosure is that of integrated electronic circuits, in particular CMOS circuits, and more specifically circuits including logic cells, such as logic gates, memories or microprocessors.

More specifically, the disclosure relates to the hardening of logic cells in such circuits. The term hardening refers to the desensitisation of an integrated circuit with respect to ionising particles present in a radiative environment.

BACKGROUND

In general, the particles found in various radiative environments (for example, the space or atmospheric radiative environment) interact with the materials comprising an integrated circuit, in particular semiconductor materials (for example, silicon).

The effects of the impact of a charged particle on an integrated circuit can be divided into two categories: cumulative effects (or dose effects) capable of modifying the electrical characteristics of the component (threshold voltage, transistor gain, etc.) and singular effects (or SEE, for "Single Event Effects").

The disadvantages of the prior art are discussed below in the particular case of SET ("Single Event Transient") singular effects on a NOT-AND logic gate.

It is noted that a SET, also referred to as a transient voltage pulse or transient variable, is initiated when an ionising particle hits the blocked junction of a MOSFET transistor. Generally, the passage of an ionising particle (for example, a heavy ion) through the inverted polarised junction of a transistor results in the creation of electron-hole pairs in a zone centred on the track of the incident particle. These electron-hole pairs can modify the distribution of the electric field in the substrate, thus causing a collection by drift of electrons and holes. This mechanism of collection by drift, also referred to below as "funelling", may cause the appearance of a transient voltage pulse (SET).

In reference to FIG. 1a, the impact mechanisms (of a heavy ion) for the case of a NOT-AND logic gate are described.

For the sake of simplification of the description, this document will hereinafter describe only the specific case of integrated circuits operating under reference voltages 0 V and 3 V. A person skilled in the art can easily extend this teaching to any type of voltage intended to power an integrated electronic circuit.

The NOT-AND logic gate 100 receives, at a first input 1, a first command voltage VCOM 1, and, at a second input 2, a second command voltage VCOM2, and generates, at the output 3, a resulting voltage VNAND.

This NOT-AND logic gate 100 itself includes a transistor TN1, of which the gate GN1 forms the first input 1 (to which the first command voltage VCOM1 is directly applied) and of which the drain DN1 is connected to the output 3, and a transistor TN2, of which the gate GN2 forms the second input 2 (to which the second command voltage VCOM2 is applied). The source SN2 of the transistor TN2 is connected to the reference potential VSS (also referred to as low level in the rest of the description), for example of 0 V, and the drain DN2 of transistor TN2 is connected to the source SN1 of transistor TN1.

The NOT-AND logic gate 100 also includes two transistors TP1 and TP2, of which the gates GP1 and GP2 respectively receive the first command voltage VCOM1 and the second command voltage VCOM2. The sources SP1 and SP2 of the transistors TP1 and TP2 are connected to the power supply VCC of the circuit (also referred to as high level in the rest of the description), for example of 3 V, and their drains DP1 and DP2 are connected to the drain DN1 of transistor TN1.

Thus, when the first and second command voltages VCOM1 and VCOM2 are substantially equal to the power supply VCC, i.e. 3 V, then the resulting voltage VNAND, generated at the output 3, is substantially equal to the reference potential VSS, i.e. 0 V.

Conversely, when the first command voltage VCOM1 or (and) the second command voltage VCOM2 is (are) substantially equal to the reference potential VSS, i.e. 0 V, then the resulting voltage VNAND, generated at the output 3, is substantially equal to the power supply VCC, i.e. 3 V.

As indicated above, a heavy ion can create a transient variable at the output 3 of the NOT-AND logic gate 100.

Indeed, in a first impact case, in which the transistors TP1 and TP2 are both in an off state (i.e. when the command voltages VCOM1 and VCOM2 are equal to 3 V), if a heavy ion 10 hits transistor TP1, then a transient voltage pulse appears at the output 3. This pulse, also called low-to-high pulse, corresponds to the successive switchings of the resulting voltage VNAND from 0 V (low level) to 3 V (high level), then from 3 V to 0 V.

In a second impact case, in which the transistors TP1 and TP2 are both in an off state (i.e. when the command voltages VCOM1 and VCOM2 are equal to 3 V), if a heavy ion 10 hits transistor TP2, then a low-to-high pulse appears at the output 3.

Then, in a third impact case, in which the transistor TN1 is in an off state (i.e. when the command voltage VCOM1 is equal to 0 V) and the transistor TN2 is in an on state (i.e. when the command voltage VCOM2 is equal to 3 V), if a heavy ion 10 hits the transistor TN1, then a transient voltage pulse appears at the output 3. This pulse, also called high-to-low pulse, corresponds to the successive switches of the resulting voltage VNAND from 3 V (high level) to 0 V (low level), then from 0 V to 3 V.

Finally, in a fourth impact case, in which the transistor TN2 is in an off state (i.e. when the command voltage VCOM2 is equal to 0 V) and the transistor TN1 is in an on state (i.e. when the command voltage VCOM1 is equal to 3 V), if a heavy ion 10 hits the transistor TN2, then a high-to-low pulse appears at the output 3.

These transient voltage pulses generated at the output 3 of the NOT-AND gate 100 can cause a logic error, leading to a critical failure of the system in which the logic gate 100 is implemented.

A well-known technique for preventing the propagation of erroneous information (i.e. a SET) in a set of cascade-mounted logic cells is based on the use of intermediate transistors.

This hardening technique consists of providing two redundant outputs and placing a set of intermediate PMOS and NMOS transistors between a first transistor block, including only PMOS transistors, and a second transistor block, including only NMOS transistors, so as to distinguish the first block from the second block.

In other words, this set of intermediate transistors makes it possible not to propagate a SET appearing at the output of the first block to the output of the second block, and the inverse.

In relation to FIG. 1b, a cell of this type, known as a "Dual Stream Redundancy", referenced 200, will now be described.

As will be seen, in all of the figures of this document, the same elements are designated with the same numeric reference.

The "Dual Stream" cell 200 includes a pair of intermediate transistors 202 placed between a first PMOS transistor block 201 and a second NMOS transistor block 203.

The first PMOS transistor block 201 includes transistors TP1 and TP2 of the NOT-AND logic gate 100 (FIG. 1a). The sources SP1 and SP2 of transistors TP1 and TP2 are connected to the power supply VCC of the circuit and their drains DP1 and DP2 are mutually connected, so as to form a first output 4, also called path P in the description below.

The second NMOS transistor block 203 includes transistors TN1 and TN2 of the NOT-AND logic gate 100 (FIG. 1a). The source SN2 of transistor TN2 is connected to the reference potential VSS and its drain DN2 is connected to the source SN1 of transistor TN1, of which the drain DN1 forms a second output 5, also called path N in the description below.

The pair of intermediate transistors 202 includes a first intermediate transistor TN3, of which the gate GN3 is connected to the first output 4 and the drain DN3 is connected to the second output 5. The source SN3 of the transistor TN3 is connected to the power supply VCC.

The pair of intermediate transistors 202 also includes a second intermediate transistor TP3, of which the gate GP3 is connected to the second output 5 (path N) and the drain DP3 is connected to the first output 4 (path P). The source SP3 of transistor TP3 is connected to the reference potential VSS.

For the sake of clarity, only the operation of the dual stream cell for various values of the first command voltage VCOM1 and for a second command voltage VCOM2 equal to the power supply VCC will be described below.

When the second command voltage VCOM2 is equal to 3 V, transistor TP2 is placed in an off state (open switch) and transistor TN2 is placed in an on state (closed switch), in which it connects the source of the transistor TN1 to the reference potential VSS.

FIG. 2a shows the simplified diagram of the dual stream cell 200 for the case in which the first command voltage VCOM1 is equal to the reference potential VSS. When the first command voltage VCOM1 is equal to 0 V, the transistor TN1 is placed in an off state and transistor TP1 is placed in an on state, in which it polarises the gate GN3 of the intermediate transistor TN3 with a high level, i.e. 3 V. The intermediate transistor TN3 is therefore in an on state, in which it sets the output voltage VNOUT, generated on the path N, at a high degraded level (i.e. at a level equal to the difference between the high level of 3 V and the threshold voltage of the transistor (generally 0.7 V)). The vertical PN (junction) diode D1 of the input transistor TN1 is inversely polarised. When an ionising particle 10 (or heavy ion) passes through, the funnelling phenomenon short-circuits the diode D1 and causes the transient change in the output voltage VNOUT from 3 V (high level) to 0 V (low level). Due to the presence of the intermediate transistor TN3, placed between path P and path N, the high-to-low pulse (SET) generated on path N is not propagated to path P. The output voltage VPOUT, generated on path P, remains unaffected, i.e. equal to the power supply VCC of 3 V (because the transistor TP1 is on).

FIG. 2b shows the simplified diagram of the dual stream cell 200 for the case in which the first command voltage VCOM1 is equal to the power supply VCC. When the first command voltage VCOM1 is equal to 3 V, the transistor TP1 is placed in an off state and transistor TN1 is placed in an on state, in which it polarises the gate GP3 of the intermediate transistor TP3 with a low level, i.e. 0 V. The intermediate transistor TP3 is therefore in an on state, in which it sets the output voltage VPOUT, generated on the path P, at a low degraded level (i.e. at a level equal to the threshold voltage of the transistor, 0.7 V). The vertical PN Function) diode D2 of the input transistor TP1 is inversely polarised. When an ionising particle 10 (or heavy ion) passes through, the funnelling phenomenon short-circuits the diode D2 and causes the transient change in the output voltage VPOUT from 0 V (low level) to 3 V (high level). Due to the presence of the intermediate transistor TP3, placed between path P and path N, the low-to-high pulse (SET) generated on path P is not propagated to path N. The output voltage VNOUT, generated on path N, remains unaffected, i.e. equal to the reference potential VSS of 0 V (because the transistor TN1 is on).

When the intermediate transistors TN3 and TP3 are impacted by an ionising particle when they are off (TN3 if off when VCOM1 is at the high level and TP3 is off when VCOM1 is at the low level), the absence of voltage at the terminals of the vertical PN diodes D1 and D2 of transistors TN1 and TP1 prevents the funnelling phenomenon and the transient pulses generated on paths N and P are then very weak. In this case, the charges are evacuated by recombination.

Thus, this dual stream cell makes it possible to maintain the high-to-low pulses on path N and the low-to-high pulses on path P. In other words, in the case of impact by an ionising particle, the dual stream cell allows either the change in the output voltage VNOUT to the low level or the change in the output voltage VPOUT to the high level.

The dual stream cell is therefore insensitive to SETs because it enables non-erroneous information to be delivered on at least one path P or N.

As shown in FIG. 1c, the dual stream cell 200 can be connected to an inverter 300 itself including two transistors TP4 and TN4, of which the gates GP4 and GN4 respectively receive the output voltages VPOUT and VNOUT, so that:

when the voltage VPOUT is at the low level, the transistor TP4 is placed in an on state, in which it sets the output voltage (not shown) at the high level, i.e. 3 V;

when the voltage VNOUT is at the high level, the transistor TN4 is placed in an on state, in which it sets the output voltage (not shown) at the low level, i.e. 0 V.

Thus, when the output voltages VPOUT and VNOUT have short disturbances (SET), it is possible to have a high-impedance output configuration in which the inverter memorises the current state of the output voltage (no change in the output voltage).

This dual stream cell has shown significant progress in integrated circuit hardening mechanisms. However, it has a certain number of disadvantages.

First, this solution of the prior art has an excessive static electrical consumption. Indeed, the intermediate transistors TP3 and TN3 respectively transmit a degraded low level on path P and a degraded high level on path N.

In reference to FIG. 3a, when the first command voltage VCOM1 is equal to the low level, the transistor TP1 polarises the gate GN3 of the intermediate transistor TN3. The latter, of which the source SN3 is connected to the power supply VCC of the circuit, transmits, on its drain DN3, a slightly degraded high level 6, leading to a very slight saturation of the intermediate transistor TP3. This very slight saturation will therefore create a direct path 7 between the power supply and the reference potential, thus causing an increase in the current consumption.

The term "degraded level" refers to a level offset by the threshold voltage of the transistor.

Conversely, an as shown in FIG. 3*b*, when the first command voltage VCOM1 is equal to the high level, the transistor TN1 polarises the gate GP3 of the intermediate transistor TP3. The latter, of which the source SP3 is connected to the reference potential VSS of the circuit, transmits, on its drain DP3, a slightly degraded low level 8, leading to a very slight saturation of the intermediate transistor TN3. This very slight saturation will therefore create a direct path 9 between the power supply and the reference potential, thus causing an increase in the current consumption.

As already indicated (FIG. 1*c*), the dual stream cell must be mounted in series with an inverter, so as to be capable of restoring a non-disturbed output signal.

Another major disadvantage of this technique therefore lies in the fact that the inverter is sensitive to the impact of the ionising particles.

SUMMARY

An embodiment of the present invention is directed to a logic cell for an integrated circuit, including redundant outputs, a first output equipped with an output transistor of type P and a second output equipped with an output transistor of type N.

The logic cell includes isolation means connecting said first and second outputs and forming isolation resistance.

Thus, an embodiment is based on an entirely novel and inventive approach to the hardening of a CMOS logic cell. Indeed, an embodiment proposes inserting a resistance between the two outputs of the cell. This resistance thus makes it possible to prevent the propagation of transient pulses (or SET) from one output to another. In addition, the static electrical consumption of the cell is significantly reduced, because any direct link between the power supply of the circuit and the ground is suppressed.

According to an advantageous aspect of an embodiment of the invention, said isolation resistance is greater than the resistance of the first and/or second output transistors.

According to an embodiment of the invention, the isolation resistance and the resistances of the output transistors form a voltage dividing bridge, enabling the amplitude and width of the transient pulses from one output to another to be reduced.

Preferably, said isolation means include a first isolation transistor of type P mounted in series with a second isolation transistor of type N, with the drains of the first and second isolation transistors being connected respectively to the drains of the first and second output transistors.

Advantageously, the gate of the first isolation transistor is connected to a first reference voltage and the gate of the second isolation transistor is connected to a second reference voltage.

Thus, an embodiment of the invention proposes independent control of the isolation transistors.

Preferably, the first reference voltage is a ground and the second reference voltage is a power supply voltage.

According to an embodiment of the invention, each isolation transistor is configured in an on state, in which it acts as a resistance.

Advantageously, the width of the channel of each of said isolation transistors is smaller than half the width of the channel of each of said output transistors.

In an embodiment of the invention, said isolation means include means for reducing at least one time lag between the signals present on said first and second outputs.

An embodiment of invention therefore proposes a compensation for delays, due to the insertion of a resistive path between the outputs.

Advantageously, the reduction means include a first bypass transistor of type P, of which the gate is connected to the gate of the output transistor of type P, the source is connected to the second reference voltage and the drain is connected to the sources of the isolation transistors, and a second bypass transistor of type N, of which the gate is connected to the gate of the output transistor of type N, the source is connected to the first reference voltage and the drain is connected to the sources of the isolation transistors.

According to an advantageous aspect of an embodiment of the invention, the logic cell also includes means for filtering at least one disturbance of the signals present on the first and/or the second output due to at least one charged particle on at least one of the transistors.

Thus, it is possible to reduce the amplitude and the width of the transient pulses appearing at the output connected to the transistor impacted by the ionising particle.

Preferably, said filtering means include at least one transistor with a commanded well.

Advantageously, said filtering means include a first filtering transistor of type P with a commanded well of which the source is connected to the second output, the drain is connected to the first output and the gate is connected to the input of said cell and/or a second filtering transistor of type N with a commanded well of which the drain is connected to the second output, the source is connected to the first output and the gate is connected to the input of said cell.

According to an embodiment of the invention, the transistor(s) with a commanded well act as a diode, making it possible to evacuate the charges of the transient pulse in the substrate of the transistor with a commanded well. Thus, it is possible to obtain a filtering or a reduction of the peaks due to the impacts of heavy ions.

Moreover, the transistor(s) with a commanded well make it possible to obtain a cell that operates at a higher dynamic speed. Indeed, they make it possible to compensate for the effect of reduction of the isolation resistance dynamics. Moreover, they also make it possible to transmit the signal from a given output to another output, without degradation of this signal.

In an embodiment of the invention, said isolation means include a third isolation transistor of type P with a commanded well of which the source is connected to the second output, the drain is connected to the first output and the gate is connected to the input of said cell and/or a fourth isolation transistor of type N with a commanded well of which the drain is connected to the second output, the source is connected to the first output and the gate is connected to the input of said cell.

Thus, an embodiment of the invention proposes isolation means capable of filtering or reducing the amplitude and width of the transient pulses.

Preferably, the source of the output transistor of type P is connected to the second reference voltage and the source of the output transistor of type N is connected to the first reference voltage and the input of said cell is connected to the gates of the output transistors.

Thus, the output transistors form an inverter.

An embodiment of invention also relates to an integrated circuit including a logic cell as described above.

Other features and advantages will become more clear from the following description of an embodiment, given by way of a simple illustrative and non-limiting example, and the appended drawings.

DETAILED DESCRIPTION OF ILLUSTRATIVE EMBODIMENTS

The general principle of an embodiment of the invention is based on the insertion of a resistive decoupling element between the outputs of a logic cell.

According to an embodiment of the invention, isolation means include PMOS and NMOS transistors, making it possible to create a resistive path between the outputs of the logic cell. These isolation means make it possible to isolate the transient pulses (or SET) from one output to another, and, as necessary, to suppress them by evacuation of charges or by level restoration.

For the sake of simplification of the description, the rest of this document will describe only an inverter-type logic cell with two outputs, in which a resistive decoupling mechanism is implanted. A person skilled in the art can easily extend this teaching to any type of logic cell equipped with two outputs, for example a NOT-AND logic gate and a SRAM memory element ("Static Random Access Memory").

Figure 1A:
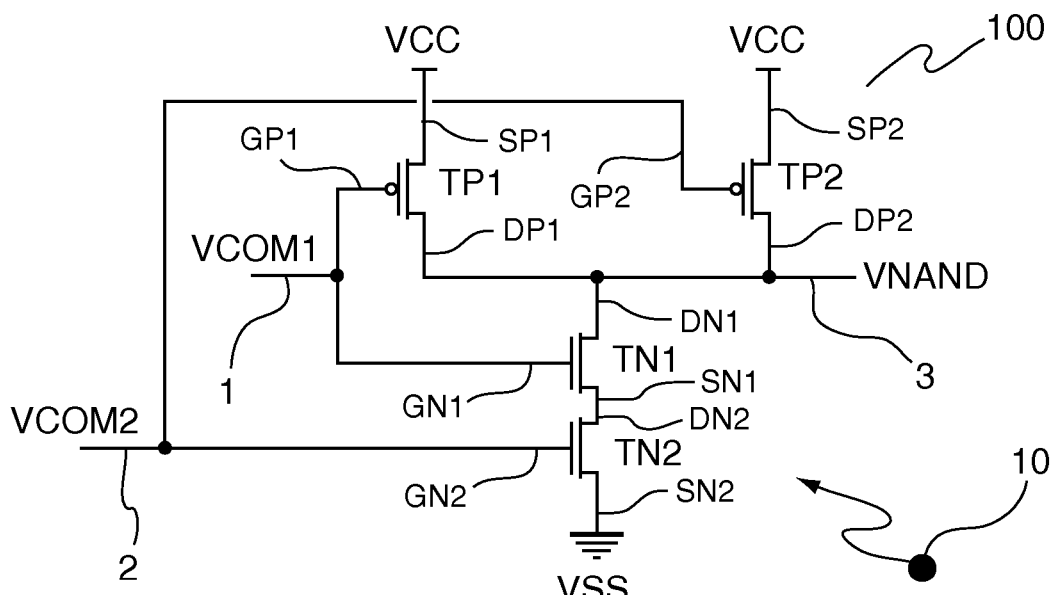
FIG. 1a is a diagram of a conventional NOT-AND logic gate based on CMOS transistors.
Figure 1B:
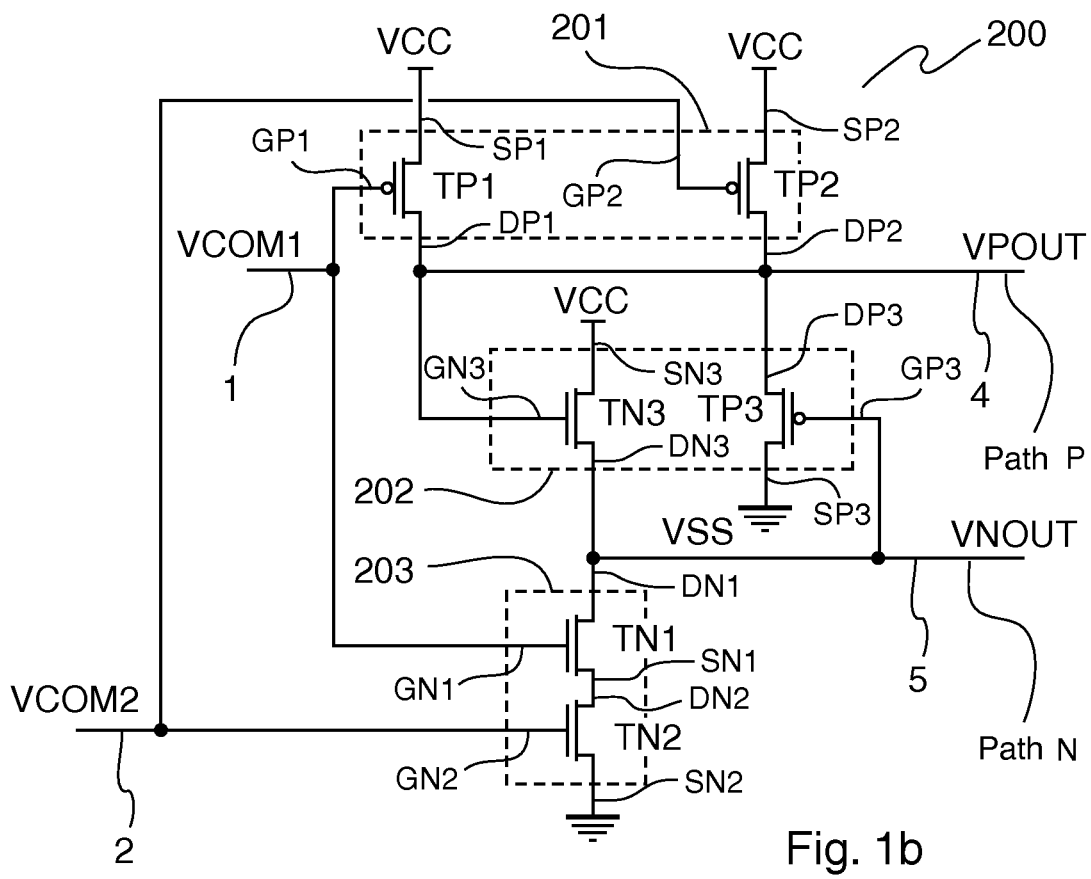
FIG. 1b is a diagram of a conventional dual stream cell based on intermediate transistors.
Figure 1C:
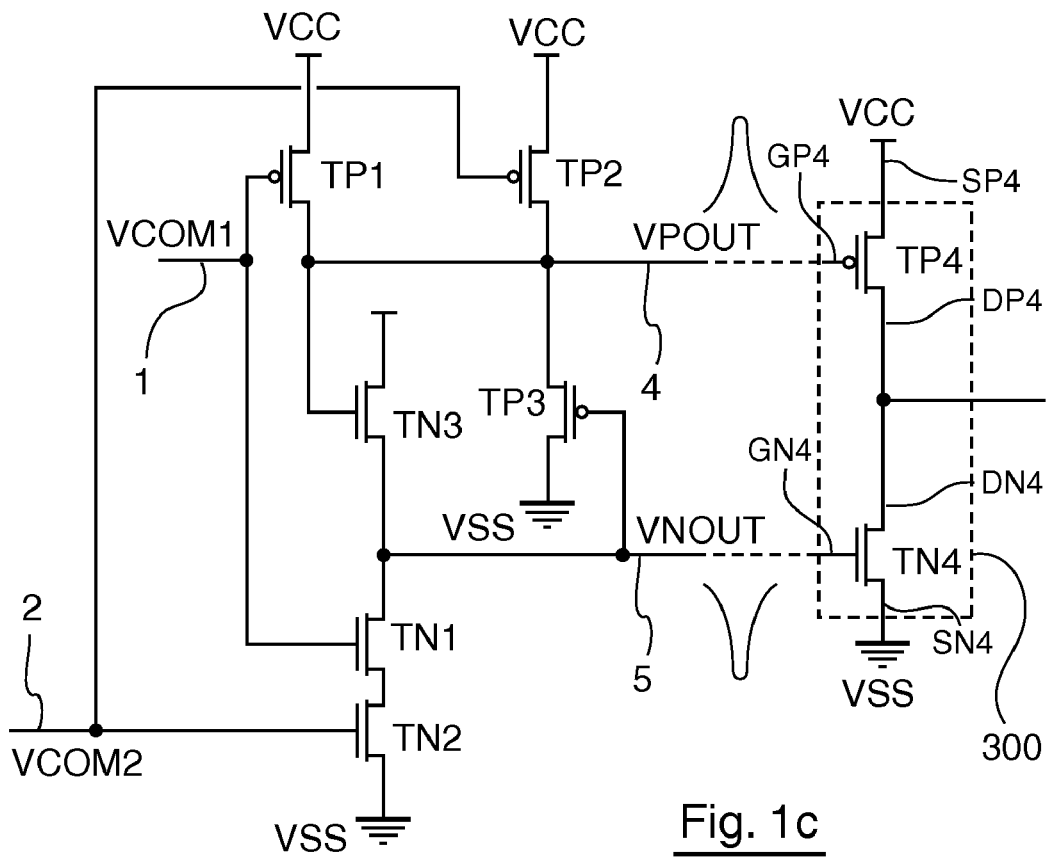
FIG. 1c is a diagram of an inverter mounted in cascade with the cell of FIG. 1b.
Figure 2A:
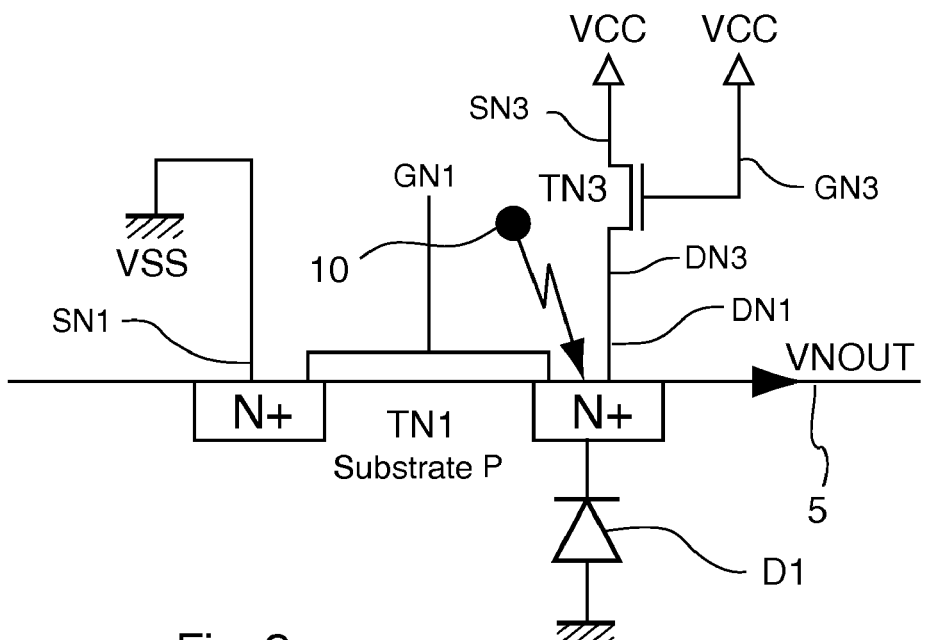
FIGS. 2a and 2b respectively show first and second cases of impact of an ionising particle on the cell of FIG. 1b.
Figure 2B:
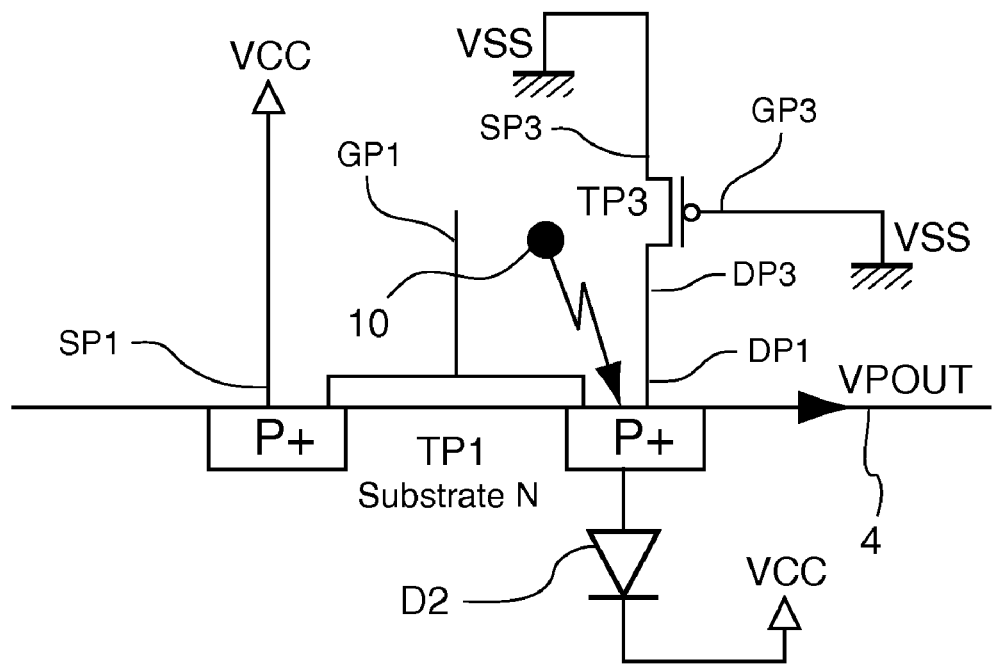
Figure 3A:
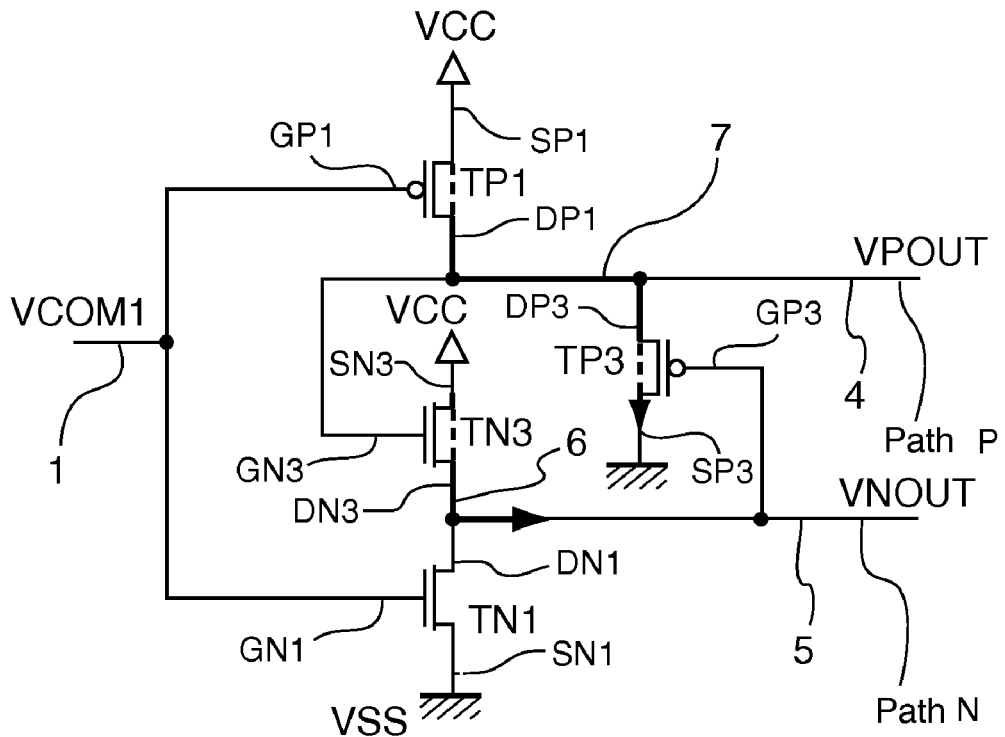
FIGS. 3a and 3b respectively show the operation of the conventional dual stream cell for the first and second cases of FIGS. 2a and 2b.
Figure 3B:
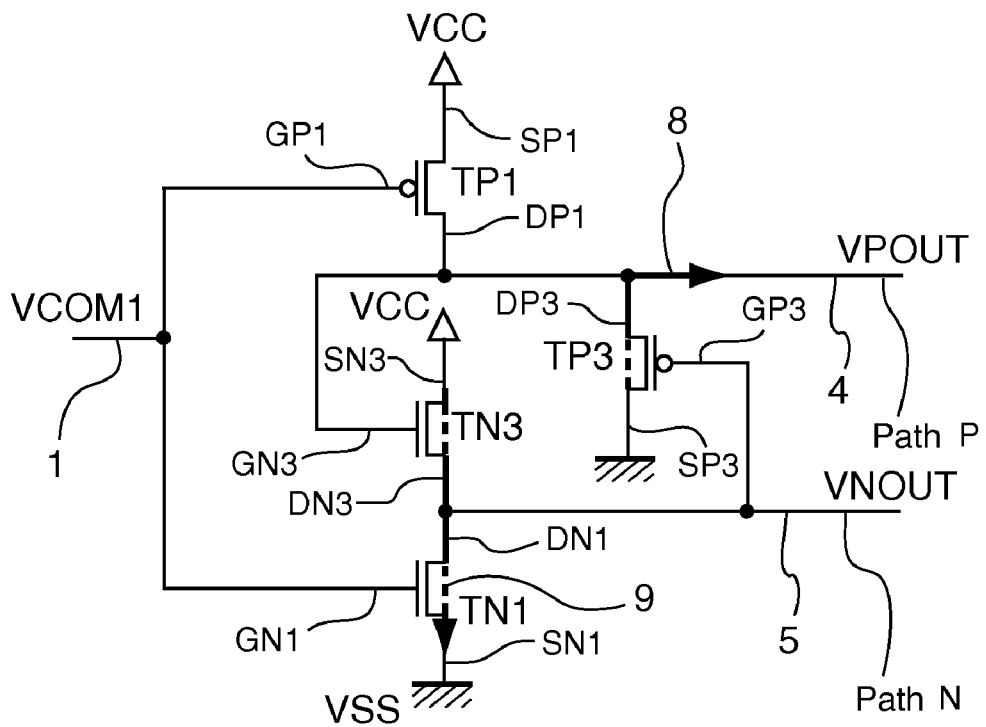
Figure 4:
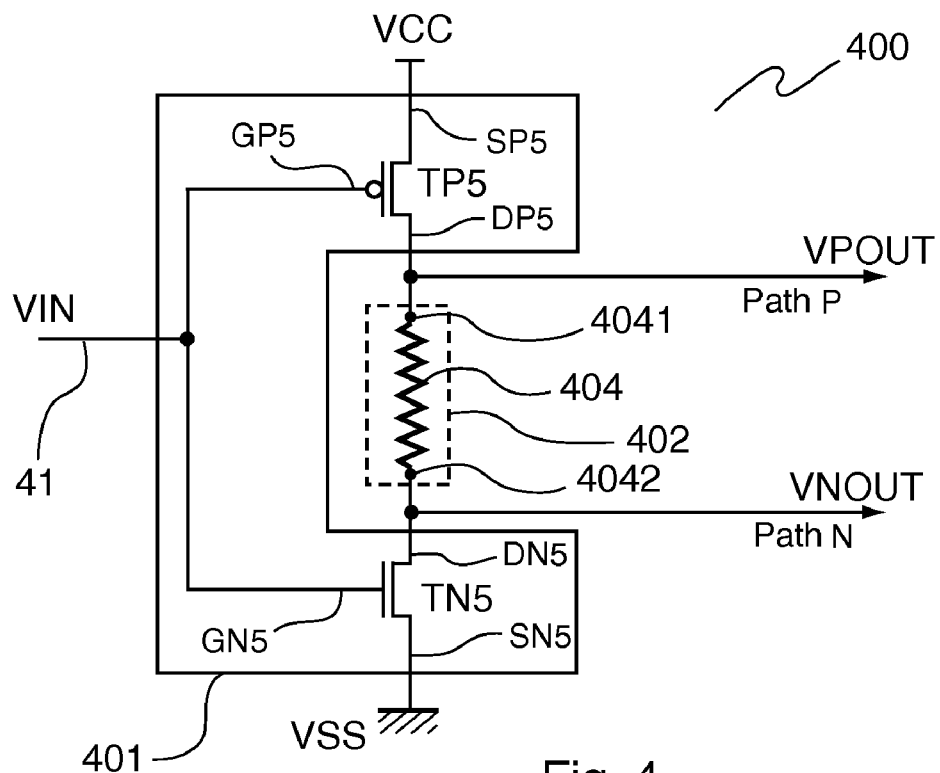
FIG. 4 shows the diagram of a CMOS logic cell according to an embodiment of the invention.

In relation to FIG. 4, a CMOS logic cell 400 according to an embodiment of the invention will now be described.

In this embodiment, the CMOS logic cell 400 includes:
 isolation means 402 including an isolation resistance 404, specific to an embodiment of the invention; and
 a conventional inverter 401 with two outputs (referred to as path P and path N).

The inverter 401 receives, at an input 41, an input signal VIN and delivers, at the first "path P" and second "path N" outputs, inverted input signals VPOUT and VNOUT, respectively. This inverter 401 includes a transistor TP5, of which the source SP5 is connected to the power supply VCC and of which the drain DP5 is connected to the path P, and a transistor TN5, of which the source SN5 is connected to the reference potential VSS and of which the drain DN5 is connected to the path N. The transistors TP5 and TN5 receive, at their gate GP5 and GN5, the input signal VIN.

Thus, when the input signal VIN is at the low level (i.e. equal to the reference potential VSS), i.e. 0 V, while the output signals VPOUT and VNOUT, delivered respectively on path P and path N, are both set at the high level (i.e. at the power supply VCC), i.e. 3 V.

Conversely, when the input signal VIN is at the high level (i.e. equal to the power supply VCC), i.e. 3 V, then the output signals VPOUT and VNOUT, delivered respectively on path P and path N, are both set at the low level (i.e. the reference potential VSS), i.e. 0 V.

In the embodiment shown, the isolation means 402 include an isolation resistance 404, of which a first end 4041 is connected to path P and a second end 4042 is connected to path N.

As will be seen in the description below, this isolation resistance 404 makes it possible to isolate the low-to-high pulses on path P and the high-to-low pulses on path N, so as to deliver a non-erroneous output signal (without SET) on at least one of the paths.

In greater detail, when the input signal VIN is at the low level, transistor TN5 is placed in an off state (closed switch) and transistor TP5 is placed in an on state (open switch), in which it sets the output signal VPOUT, delivered on path P, at the high level. The output signal VPOUT is routed toward path N, via the isolation resistance 404. The output signal VNOUT is therefore set at the high level.

Figure 5A:
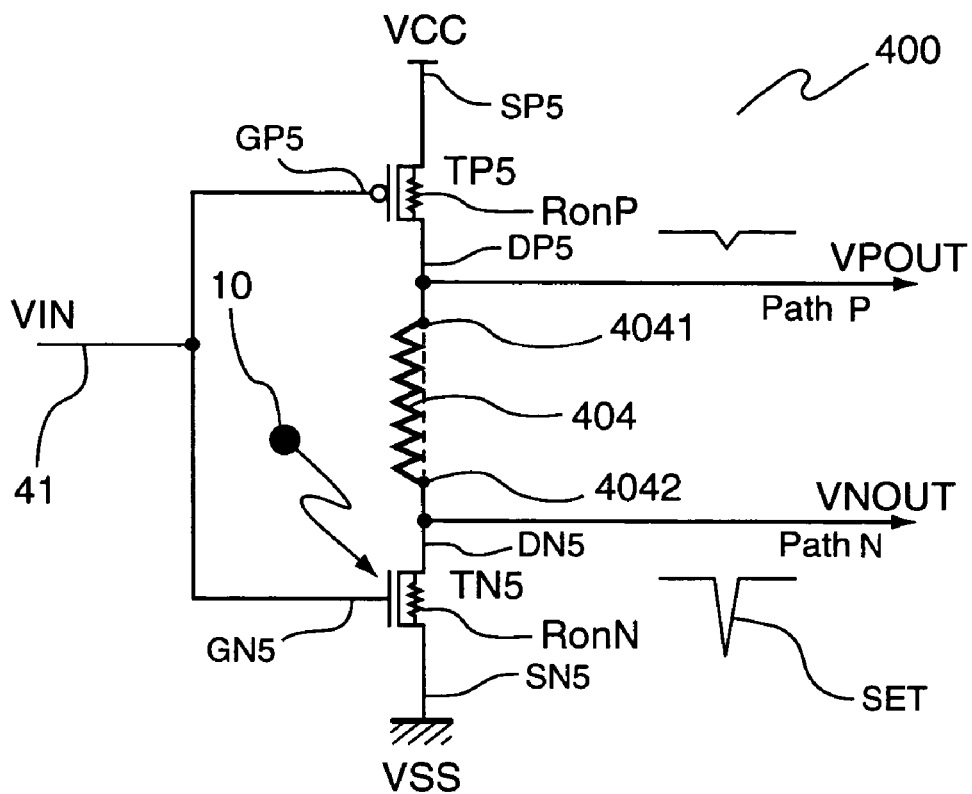
FIGS. 5a and 5b show the operation of the CMOS logic cell of FIG. 4.

As shown in FIG. 5a, when an ionising particle 10 hits the drain DN5 of the transistor TN5, the funnelling phenomenon short-circuits the drain DN5 polarised at the high level with the well of the transistor TN5 polarised at the low level and causes the transient switch in the output signal VNOUT from the high level (3 V) to the low level (0 V) (i.e. a high-to-low pulse). Path N, connected to the drain DN5 of the transistor TN5, is therefore transiently connected to the reference potential VSS, i.e. 0 V, thus causing a discharge of the capacity of the drain DN5 of the transistor TN5.

According to a particular aspect of an embodiment of the invention, the isolation resistance 404 and the resistance RonP of the transistor TP5 form a voltage dividing bridge, of which the input corresponds to the second end 4042 of the isolation resistance 404 and of which the output corresponds to the first end 4041 of this isolation resistance.

In the present embodiment, the value of the resistance RonP of the transistor TP5 is lower than the value of the isolation resistance 404.

Thus, when a high-to-low pulse appears at the second end 4042 of the isolation resistance 404, the voltage disturbance generated at the terminals of the resistance RonP has a much lower amplitude than the amplitude of the pulse of path N and is lower than the threshold voltage of the transistor TP5. In other words, the isolation resistance 404 makes it possible to maintain the high-to-low pulses on path N (no propagation to path P).

Figure 5B:
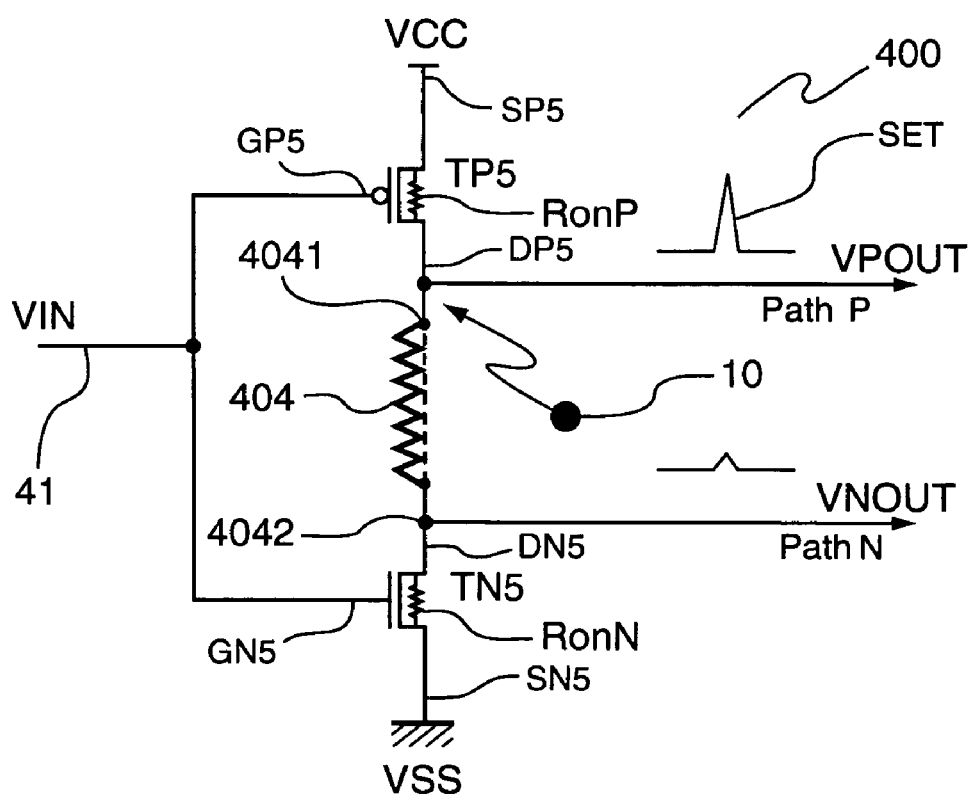

Conversely, and as shown in FIG. 5b, when the input signal VIN is at the high level, the transistor TP5 is placed in an off state (closed switch) and transistor TN5 is placed in an on state (open switch), in which it sets the output signal VNOUT, delivered on path N, at the low level. The output signal VNOUT is routed toward path P, via the isolation resistance 404. The output signal VPOUT is therefore set at the low level.

When an ionising particle 10 hits the drain DP5 of the transistor TP5, the funnelling phenomenon short-circuits the drain DP5 polarised at the low level with the well of the transistor TP5 polarised at the high level and causes the transient switch in the output signal VPOUT from the low level (0

V) to the high level (3 V) (i.e. a low-to-high pulse). Path P, connected to the drain DP5 of the transistor TP5, is therefore transiently connected to the power supply VCC, i.e. 3 V, thus causing a discharge of the capacity of the drain DP5 of the transistor TP5.

The isolation resistance 404 and the resistance RonN of the transistor TN5 form a voltage dividing bridge, of which the input corresponds to the first end 4041 of the isolation resistance 404 and of which the output corresponds to the second end 4042 of this isolation resistance.

In this embodiment, the value of the resistance RonN of the transistor TN5 is lower than the value of the isolation resistance 404.

Thus, when a low-to-high pulse appears at the first end 4041 of the isolation resistance 404, the voltage disturbance generated at the terminals of the resistance RonN has a much lower amplitude than the amplitude of the pulse of path N and is lower than the threshold voltage of the transistor TN5. In other words, the isolation resistance 404 makes it possible to maintain the low-to-high pulses on path P (no propagation to path N).

Figure 6:
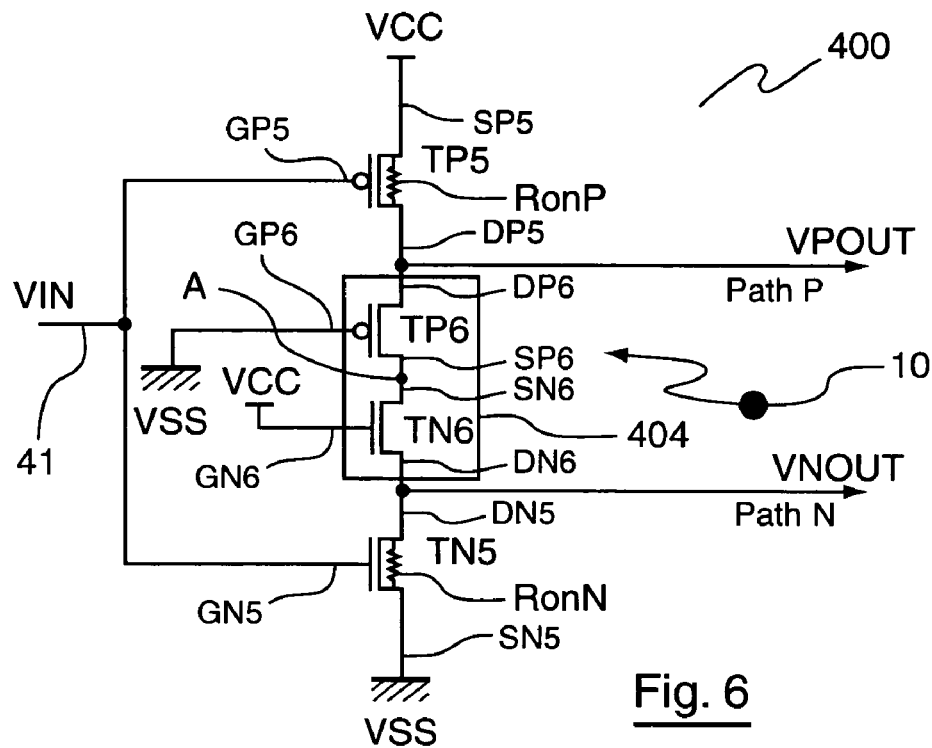
FIG. 6 shows the detailed diagram of an isolation resistance according to a first embodiment of the invention.

In reference to FIG. 6, the architecture of the isolation resistance 404 (FIG. 4) according to a first embodiment of the invention will now be described.

This particular embodiment proposes forming the isolation resistance 404 by placing two isolation transistors in series: a PMOS transistor TP6 and an NMOS transistor TN6.

To obtain a dividing bridge as described above in relation to FIGS. 5a and 5b, the value of the isolation resistance 404 must be greater than the value of the resistances RonP and RonN of the transistors TP5 and TN5, forming the inverter 401. To do this, the physical dimensions of the isolation transistors TP6 and TN6 must be smaller than those of transistors TP5 and TN5 of the inverter 401.

In the embodiment shown, the width of the channel of the isolation transistors TP6 and TN6 is two times smaller than that of the transistors TP5 and TN5 of the inverter 401.

In greater detail, the isolation resistance 404 itself includes an isolation transistor TP6, of which the drain DP6 is connected to path P (i.e. to the drain DP5 of the transistor TP5) and of which the source SP6 is connected to a mid-point A, and an isolation transistor TN6, of which the drain DN6 is connected to path N (i.e. to the drain DN5 of the transistor TN5) and of which the source SN6 is connected to the mid-point A.

The isolation transistors TP6 and TN6 are polarised so as to constantly be in an on state. To do this, the gate GP6 of the isolation transistor TP6 is connected to the power supply VCC of the circuit and the gate GN6 of the isolation transistor TN6 is connected to the reference potential VSS.

Figure 7:
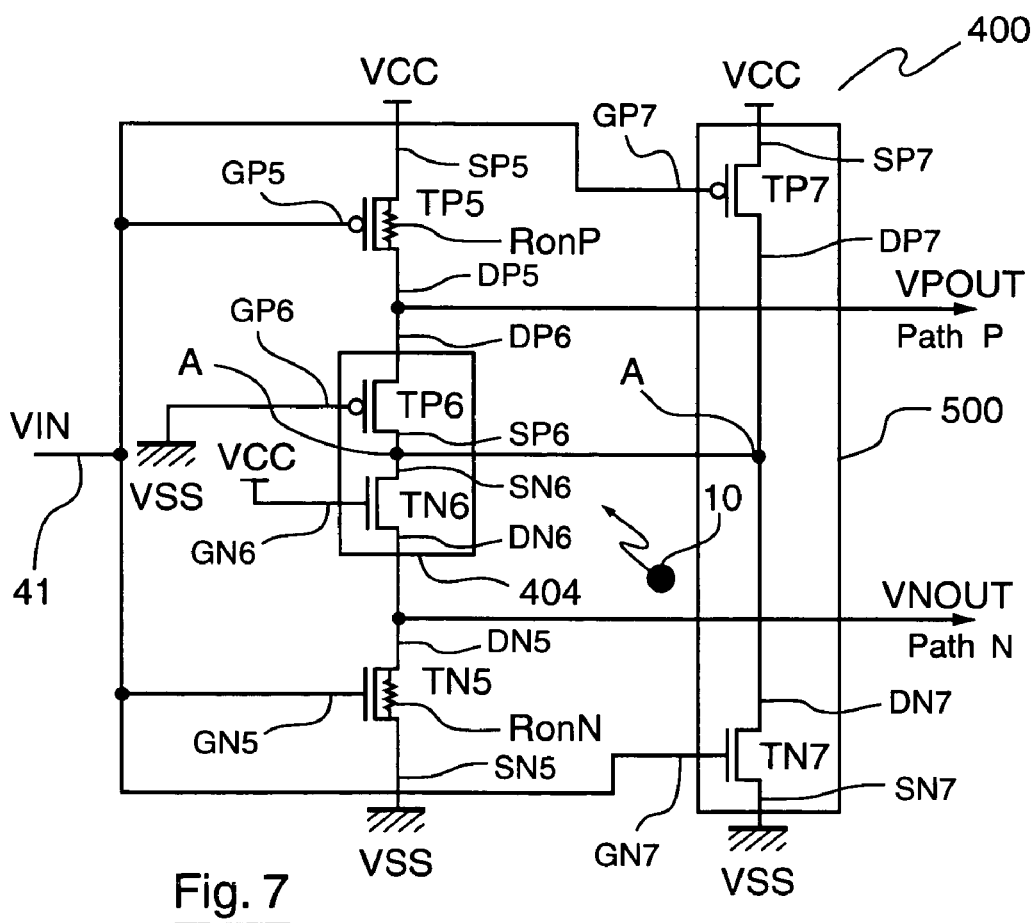
FIG. 7 shows the detailed diagram of an isolation resistance according to a second embodiment of the invention.

In reference to FIG. 7, the architecture of the isolation resistance 404 (FIG. 4) according to a second embodiment of the invention will now be described.

The insertion of the isolation resistance 404 (i.e. the creation of the resistive path) can cause a notable time lag (or "skew") between the output signals VPOUT and VNOUT delivered on paths P and N, respectively.

For example, when the input signal VIN is at the low level, the transistor TN5 is in an off state and the transistor TP5 is in an on state, in which it sets the output signal VPOUT, delivered on the path P, at the high level. The output signal VPOUT is then routed toward path N, via the isolation resistance 404. This isolation resistance 404, because of its high resistive value, can delay, by several hundred picoseconds, the change in the output signal VNOUT from the low level to the high level.

In this alternative implementation, the isolation transistors TP6 and TN6, as described above in relation to FIG. 6, cooperate with acceleration means 500 (also called time lag reduction means below), enabling the delays between paths P and N to be reduced.

As will be seen below, the acceleration means 500 make it possible to short-circuit the isolation transistors TP6 and TN6, according to the level of the input signal VIN.

These acceleration means 500 include a bypass transistor TP7 (also called "shunt" transistor in the description below), of which the source SP7 is connected to the power supply VCC and of which the drain DP7 is connected to the mid-point A (i.e. to the sources SP6 and SN6 of the transistors TP6 and TN6), and a bypass transistor TN7, of which the source SN7 is connected to the reference potential VSS and of which the drain DN7 is connected to the mid-point A. The bypass transistors TP7 and TN7 receive, at their gate GP7 and GN7, the input signal VIN.

Thus, when the input signal VIN is at the low level, the transistor TN5 is in an off state and the transistor TP5 is in an on state, in which it sets the output signal VPOUT, delivered on path P, at the high level. Transistor TN7 is in an off state and transistor TP7 is in an on state, in which it directly applies the power supply VCC to the mid-point A. The transistor TN6, which is constantly in an on state, transfers the level of the mid-point A on path N. The output signal VNOUT is therefore set at the same level as the output signal VPOUT, i.e. at the high level.

It is important to note that the resistance of the shunt transistor TP7 is much lower than that of the isolation transistor TP6. Thus, the shunt transistor TP7 more quickly routes the power supply VCC to the mid-point A. The isolation transistor TP6 is therefore "short-circuited" by the shunt transistor TP7.

Conversely, when the input signal VIN is at the high level, the transistor TP5 is in an off state and transistor TN5 is in an on state, in which it sets the output signal VNOUT, delivered on the path N, at the low level. Transistor TP7 is in an off state and transistor TN7 is in an on state, in which it directly applies the reference potential VSS to the mid-point A. The transistor TP6, which is constantly in an on state, transfers the level from mid-point A on path P. The output signal VPOUT is therefore set at the same level as the output signal VNOUT, i.e. at the low level.

It is also noted that the resistance of the shunt transistor TN7 is much lower than that of the isolation transistor TN6. Thus, the shunt transistor TN7 more quickly routes the reference potential VSS to the mid-point A. The isolation transistor TP6 is therefore "short-circuited" by the shunt transistor TP7.

In an embodiment, the shunt transistors TP7 and TN7 are identical to the transistors TP5 and TN5 of the inverter, respectively.

Figure 8A:
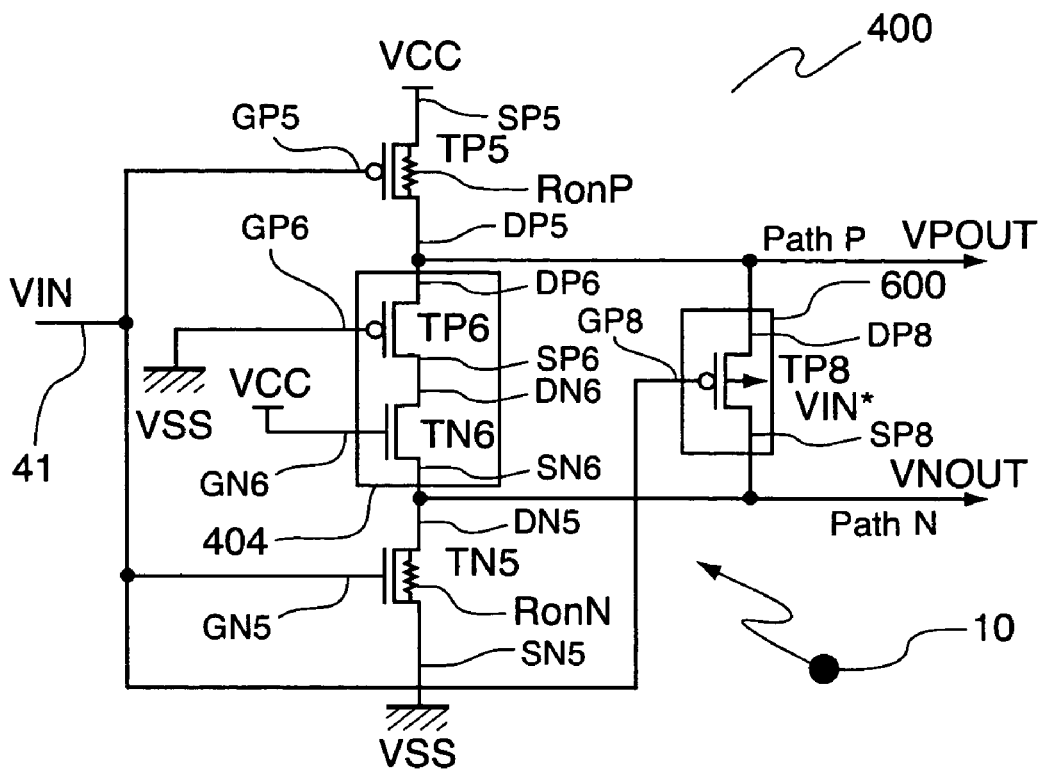
FIGS. 8a and 8b respectively show the detailed diagram and the operation of an isolation resistance according to a third embodiment of the invention.

In relation to FIG. 8a, the architecture of the isolation resistance 404 (FIG. 4) according to a third embodiment of the invention will now be described.

As already indicated, the CMOS logic cell 400 includes an isolation resistance 404 making it possible to isolate the low-to-high pulses on path P and the high-to-low pulses on path N. However, this isolation resistance 404 does not make it possible to reduce the amplitude and the width of these isolated pulses, which are a source of erroneous information.

In this other alternative embodiment, the isolation transistors TP6 and TN6, as described above in relation to FIG. 6, cooperate with evacuation means 600 (also called filtering means below), making it possible to reduce the amplitude and the width of the pulses (or SET) isolated on paths P and N. As will be seen below, the evacuation means 600 are mounted in parallel to the isolation resistance 404.

These evacuation means 600 include a transistor with a commanded well TP8, of which the source SP8 is connected to path N and of which the drain DP8 is connected to path P. The commanded-well transistor TP8 receives, at its gate GP8, the input signal VIN.

It is important to note that the gate GP8 of the transistor TP8 is polarised by the input signal VIN, while the well of this transistor TP8 is polarised by the inverse of the input signal VIN*.

Thus, when the input signal VIN is at the high level, transistor TP5 is in an off state and transistor TN5 is in an on state, in which it sets the output signal VNOUT, delivered on path N, at the low level. The output signal VNOUT is then routed to path P, via the isolation resistance 404. The output signal VPOUT is therefore set at the low level.

The commanded-well transistor TP8 is in an off state, and its well is polarised at the low level, because the output signals VNOUT (applied on the source SP8) and VPOUT (applied on the drain DP8) are both at the low level. Thus, this commanded-well transistor TP8, while off, cannot cause a funnelling phenomenon, when an ionising particle impacts its drain DP8. The transistor TP8 cannot therefore disturb the output signals VNOUT and VPOUT.

Figure 8B:
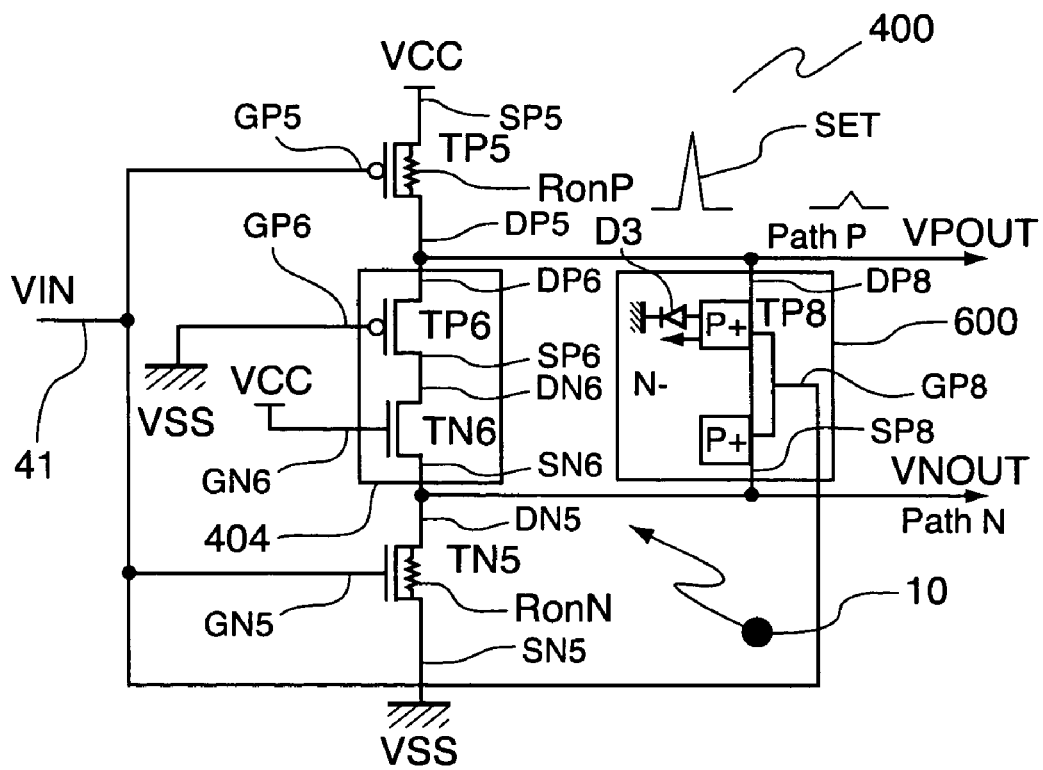
Figure 9:
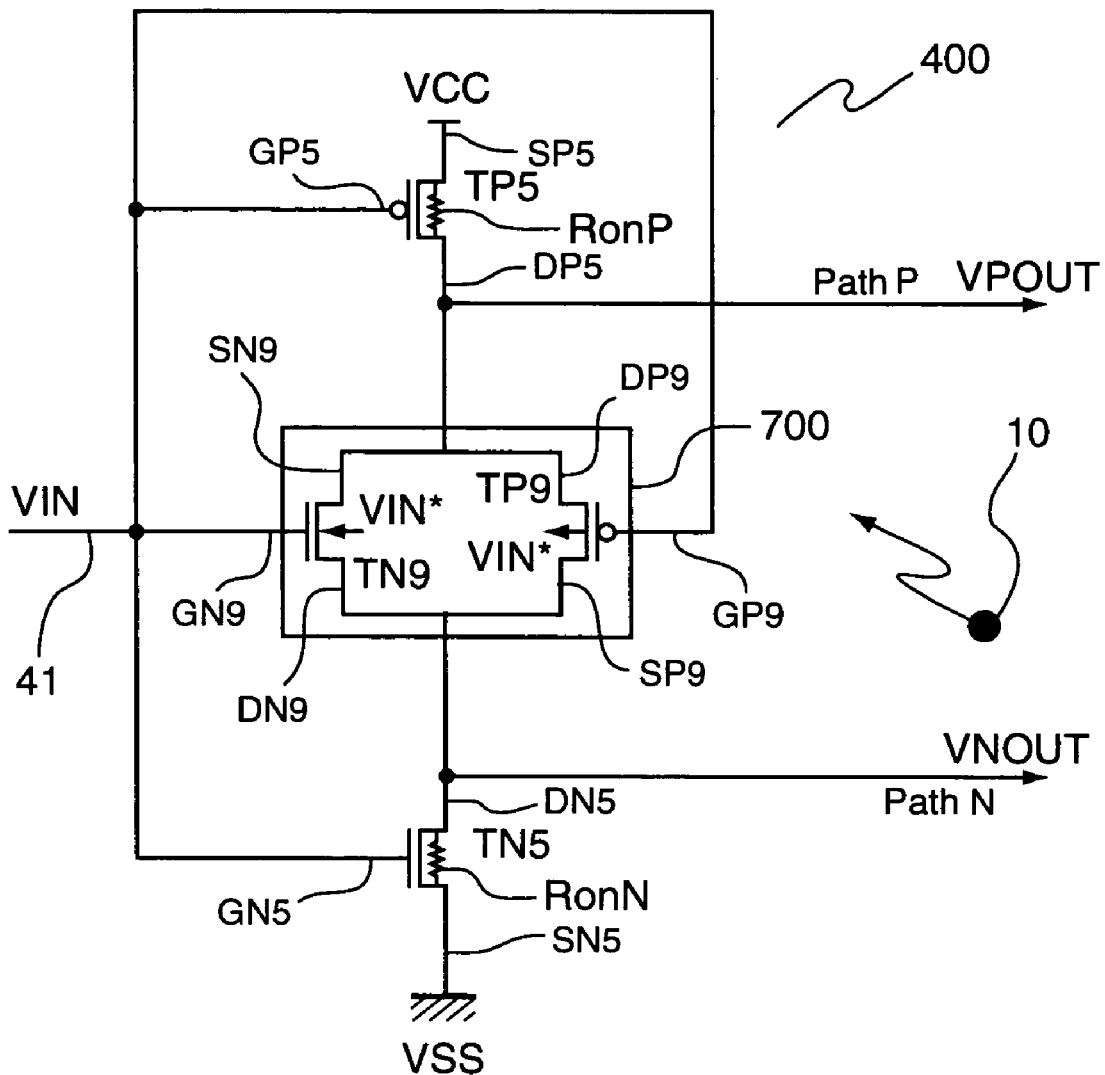
FIG. 9 shows the detailed diagram of an isolation resistance according to a fourth embodiment of the invention.

As shown in FIG. 8*b*, when an ionising particle 10 hits the drain DP5 of transistor TP5 or the drain DP6 of the isolation transistor TP6, a low-to-high pulse appears on path P.

According to an embodiment of the invention, the commanded-well transistor TP8 acts as an evacuation diode, enabling the charges present on path P in the substrate N of transistor TP8 to be evacuated.

In other words, the commanded-well transistor TP8 makes it possible to reduce the amplitude and the width of the low-to-high pulses of path P, by evacuation of the charges via the vertical PN diode D3 of transistor TP8.

However, when the input signal VIN is at the low level, transistor TN5 is in an off state and transistor TP5 is in an on state, in which it sets the output signal VPOUT, delivered on path P, at the high level.

The commanded-well transistor TP8 is in an on state (therefore, no funnelling phenomenon is possible because its drain is polarised at the same level as its well), in which it short-circuits the isolation transistors TP6 and TN6, so as to more quickly, and without degradation (i.e. without a level shift), route the high level of path P to path N. The commanded-well transistor TP8 therefore enables the level of path P to be restored on path N.

It is noted that the well of transistor TP8 is polarised at the high level, because the output signals VNOUT (applied on the source SP8) and VPOUT (applied on the drain DP8) are both at the high level. Transistor TP8 cannot therefore cause a funnelling phenomenon and disturb the output signals VNOUT and VPOUT.

In an alternative embodiment, it is possible to envisage replacing the PMOS-type commanded-well transistor TP8 with an NMOS-type commanded-well transistor, using silicon wafers of type N.

In relation to FIG. 8, the architecture of the isolation resistance 404 (FIG. 4) according to a fourth embodiment of the invention will now be described.

In this embodiment, the isolation transistors TP6 and TN6 (FIG. 6) are replaced by a commanded double well mechanism 700, produced with CMOS silicon on insulator (SOI) technology. This SOI technology advantageously makes it possible to use, in parallel, commanded-well transistors N and P.

As will be seen in the description below, this commanded double well mechanism 700 makes it possible to restore the voltage levels on both paths and to evacuate the inappropriate charges generated on both paths, so as to deliver non-erroneous output signals (without SET) on both paths P and N of the logic cell 400.

In greater detail, the commanded double well mechanism 700 includes a commanded-well transistor TP9, of which the source SP9 is connected to path N and of which the drain DP9 is connected to path P, and a commanded-well transistor TP9, of which the source SN9 is connected to path P and of which the drain DN9 is connected to path N. The commanded-well transistors TP9 and TN9 receive, at their gate GP9 and GN9, the input signal VIN.

It is important to note that the gates GP9 and GN9 of transistors TP9 and TN9 are polarised by the input signal VIN, while their wells are polarised by the inverse of the input signal VIN*.

To obtain a dividing bridge as described above in relation to FIGS. 5*a* and 5*b*, the value of the resistances of the commanded-well transistors TP9 and TN9 must be greater than the value of the resistances RonP and RonN of transistors TP5 and TN5, forming the inverter 401. To do this, the physical dimensions of the commanded-well transistors TP9 and TN9 must be smaller than those of transistors TP5 and TN5 of the inverter 401.

In an embodiment, the width of the channel of commanded-well transistors TP9 and TN9 is two times smaller than that of transistors TP5 and TN5 of the inverter 401.

It is important to note that the gates GP9 and GN9 of the commanded-well transistors TP9 and TN9 are polarised by the input signal VIN, while their wells are polarised by the inverse of the input signal VIN.

Thus, when the input signal VIN is at the high level, transistor TP5 is in an off state and transistor TN5 is in an on state, in which it sets the output signal VNOUT, delivered on path N, at the low level. The commanded-well transistor TN9 is in an on state, in which it directly applies the low level of path N to path P. The output signal VPOUT is therefore set at the same level as the output signal VNOUT, i.e. at the low level.

The commanded-well transistor TP9 is in an off state, and its well is polarised at the low level, because the output signals VNOUT (applied on the source SP9) and VPOUT (applied on the drain DP9) are both at the low level. Thus, this commanded-well transistor TP8, while off, cannot cause a funnelling phenomenon, when an ionising particle impacts its drain DP9.

However, when an ionising particle 10 hits the drain DP5 of the transistor TP5 (which is in an off state), a low-to-high pulse appears on path P. In this case, the commanded-well transistor TP9 acts as an evacuation diode, enabling the charges present on path P in the substrate N of transistor TP9 to be evacuated. In other words, the commanded-well transistor TP9 makes it possible to reduce the amplitude and the width of the low-to-high pulses of path P, by evacuation of the charges via its drain-well diode (not shown).

Conversely, when the input signal VIN is at the low level, the transistor TN5 is in an off state and the transistor TP5 is in an on state, in which it sets the output signal VPOUT, delivered on path P, at the high level. The commanded-well transistor TP9 is in an on state, in which it directly applies the high level of path P to path N. The output signal VNOUT is therefore set at the same level as the output signal VPOUT, i.e. at the high level.

The commanded-well transistor TN9 is in an off state, and its well is polarised at the high level, because the output signals VNOUT (applied on the source SN9) and VPOUT (applied on the drain DN9) are both at the high level. Thus, this commanded-well transistor TN9, while off, cannot cause a funnelling phenomenon, when an ionising particle impacts its drain DN9.

However, when an ionising particle 10 hits the drain DN5 of transistor TN5 (which is in an off state), a high-to-low pulse appears on path N. In this case, the commanded-well transistor TN9 acts as an evacuation diode, enabling the charges present on path N in the substrate P of transistor TN9 to be evacuated. In other words, the commanded-well transistor TN9 makes it possible to reduce the amplitude and the width of the high-to-low pulses of path N, by evacuation of the charges via its drain-well diode (not shown).

To summarise, the CMOS logic cell, as proposed by an embodiment of the invention, has numerous advantages, of which an incomplete list is provided below:

improvement of the static electrical consumption; indeed, an embodiment of the invention makes it possible to create a resistive path between the outputs of the CMOS logic cell and to suppress any direct path between the power supply and the reference potential of the circuit;

improvement of stability; indeed, an embodiment of the invention makes it possible to reduce the amplitude and the width of the transient pulses (SET) generated on the outputs of the CMOS logic cell, regardless of the level of the input signal.

Of course, embodiments of the invention are not limited to the examples mentioned above. An inverter was described, but the same approach can of course be applied to any other logic gate with redundant outputs.

In particular, a person skilled in the art can, according to the desired isolation, modify the resistivity ratio between the isolation transistors and the inverter transistors. It is possible in particular to envisage the series arrangement of a plurality of PMOS and NMOS transistors, so as to increase the value of the isolation resistance.

In general, in other examples, the values of VCC, VSS and the ratio of the widths of the channel of the transistors can be different from those given in the case of the embodiment described above.

An embodiment of the present disclosure provides a hardening technique that is simple and effective to implement, in particular in terms of electrical consumption.

An embodiment proposes such a technique that, in a particular embodiment, enables a time lag between the signals of paths P and N of the logic cell to be minimised.

An embodiment proposes such a technique that enables the amplitude and width of the SETs on the paths P and N of the logic cell to be significantly reduced.

An embodiment also provides such a technique that does not lead to a notable increase in the size of the integrated circuit.

An embodiment also provides such a technique that is inexpensive and suitable for all standard power supply voltages of current integrated circuits.

A particular embodiment further provides such a technique that is particularly suitable for the cascading of CMOS logic cells.

Although the disclosure was described above in relation to a limited number of embodiments, a person skilled in the art, upon reading the present description, will understand that other embodiments can be imagined without going beyond the scope of this invention.

What is claimed is:

1. A logic cell for an integrated circuit, the logic circuit comprising:
    redundant outputs, including a first output equipped with an output transistor of type P and a second output equipped with an output transistor of type N; and
    an isolation element connecting said first and second outputs and forming an isolation resistance, wherein said isolation element includes:
        a first isolation transistor of type P mounted in series with a second isolation transistor of type N, with the drains of the first and second isolation transistors being connected respectively to the drains of the first and second output transistors, wherein the gate of the first isolation transistor is connected to a first reference voltage and the gate of the second isolation transistor is connected to a second reference voltage; and
        a first bypass transistor of type P, of which the gate is connected to the gate of the output transistor of type P, the source is connected to the second reference voltage and the drain is connected to the sources of the isolation transistors, and a second bypass transistor of type N of which the gate is connected to the gate of the output transistor of type N, the source is connected to the first reference voltage and the drain is connected to the sources of the isolation transistors.

2. The logic cell according to claim 1, wherein said isolation resistance is greater than the resistance of the first and/or second output transistors.

3. The logic cell according to claim 1, wherein the first reference voltage is a ground and the second reference voltage is a power supply voltage.

4. The logic cell according to claim 1, wherein the width of the channel of each of said isolation transistors is smaller than half the width of the channel of each of said output transistors.

5. The logic cell according to claim 1, wherein said first and second bypass transistors are configured to form means for reducing at least one time lag between the signals present on said first and second outputs.

6. The logic cell according to claim 1, wherein the logic cell also includes a filter, which filters at least one disturbance of the signals present on the first and/or the second output due to at least one charged particle on at least one of the transistors.

7. The logic cell according to claim 6, wherein said filter includes at least one commanded-well transistor.

8. The logic cell according to claim 7, wherein said filter includes a first commanded-well filtering transistor of type P of which the source is connected to the second output, the drain is connected to the first output and the gate is connected to the input of said cell and/or a second commanded-well filtering transistor of type N of which the drain is connected to the second output, the source is connected to the first output and the gate is connected to the input of said cell.

9. The logic cell according to claim 1, wherein said isolation element includes a commanded-well isolation transistor of type P of which the source is connected to the second output, the drain is connected to the first output and the gate is connected to the input of said cell and a further commanded-well isolation transistor of type N of which the drain is connected to the second output, the source is connected to the first output and the gate is connected to the input of said cell.

10. The logic cell according to claim 1, wherein the source of the output transistor of type P is connected to the second reference voltage and the source of the output transistor of type N is connected to the first reference voltage and the input of said cell is connected to the gates of the output transistors.

11. An integrated circuit including at least one logic cell according to claim 1.

12. A logic cell comprising:
redundant outputs, including a first output equipped with an output transistor of type P and a second output equipped with an output transistor of type N; and
isolation means connecting said first and second outputs for forming an isolation resistance, wherein said isolation means includes:
a first isolation transistor of type P mounted in series with a second isolation transistor of type N, with the drains of the first and second isolation transistors being connected respectively to the drains of the first and second output transistors, wherein the gate of the first isolation transistor is connected to a first reference voltage and the gate of the second isolation transistor is connected to a second reference voltage; and
a first bypass transistor of type P, of which the gate is connected to the gate of the output transistor of type P, the source is connected to the second reference voltage and the drain is connected to the sources of the isolation transistors, and a second bypass transistor of type N of which the gate is connected to the gate of the output transistor of type N, the source is connected to the first reference voltage and the drain is connected to the sources of the isolation transistors.

13. An integrated circuit comprising a logic cell, wherein the logic cell comprises:
redundant outputs, including a first output equipped with an output transistor of type P and a second output equipped with an output transistor of type N; and
an isolation element connecting said first and second outputs and forming an isolation resistance, wherein said isolation element includes:
a first isolation transistor of type P mounted in series with a second isolation transistor of type N, with the drains of the first and second isolation transistors being connected respectively to the drains of the first and second output transistors, wherein the gate of the first isolation transistor is connected to a first reference voltage and the gate of the second isolation transistor is connected to a second reference voltage; and
a first bypass transistor of type P, of which the gate is connected to the gate of the output transistor of type P, the source is connected to the second reference voltage and the drain is connected to the sources of the isolation transistors, and a second bypass transistor of type N of which the gate is connected to the gate of the output transistor of type N, the source is connected to the first reference voltage and the drain is connected to the sources of the isolation transistors.

* * * * *